(12) United States Patent
Bolz et al.

(10) Patent No.: US 7,675,726 B2
(45) Date of Patent: Mar. 9, 2010

(54) DEVICE FOR PROTECTING ELECTRONIC MODULES IN A MULTI-VOLTAGE ON-BOARD ELECTRICAL SYSTEM AGAINST SHORT CIRCUITS

(75) Inventors: Stephan Bolz, Pfatter (DE); Günter Lugert, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 13 days.

(21) Appl. No.: 10/566,529

(22) PCT Filed: Jul. 27, 2004

(86) PCT No.: PCT/EP2004/051622

§ 371 (c)(1),
(2), (4) Date: Jun. 5, 2006

(87) PCT Pub. No.: WO2005/013453

PCT Pub. Date: Feb. 10, 2005

(65) Prior Publication Data

US 2007/0053124 A1    Mar. 8, 2007

(30) Foreign Application Priority Data

Jul. 28, 2003    (DE) .................................. 103 34 399

(51) Int. Cl.
*H02H 3/20* (2006.01)
(52) U.S. Cl. .................. 361/91.1; 361/18; 361/111
(58) Field of Classification Search .............. 361/91.1, 361/18, 111

See application file for complete search history.

(56) References Cited

U.S. PATENT DOCUMENTS 6,031,705 A * 2/2000 Gscheidle .................. 361/111
6,172,383 B1 * 1/2001 Williams .................... 257/173

FOREIGN PATENT DOCUMENTS

| DE | 34 25 235 C1 | 2/1986 |
| EP | 0 349 750 A1 | 1/1990 |
| EP | 1 453 171 A1 | 9/2004 |

OTHER PUBLICATIONS

Translation provided by Interactive Terminology for Europe. Accessed Jan. 7, 2009.*
Motorola Inc.: "FET Applications Manual", Phoenix, Arizona, USA, First Edition 1991-DL414/D, pp. 55-57 and 267-268.

* cited by examiner

*Primary Examiner*—Ronald W Leja
*Assistant Examiner*—Christopher J Clark
(74) *Attorney, Agent, or Firm*—Laurence A. Greenberg; Werner H. Stemer; Ralph E. Locher

(57) ABSTRACT

A device for protecting electronic modules in a multivoltage on-board electrical wiring system comprising a first accumulator of a low on-board electrical wiring system voltage, against short circuits after a high on-board electrical wiring system voltage, consisting of a transistor whose drain-source path is inserted between the control device connection and the electronic module connection. The source connection of the transistor is linked to the electronic module connection. A gate resistor and a diode guiding the current in the direction of the plus pole of the first accumulator are parallel-mounted between the gate connection of the transistor and the plus pole of the accumulator. A Zener diode is arranged between the gate connection and source connection of the transistor.

6 Claims, 2 Drawing Sheets

DEVICE FOR PROTECTING ELECTRONIC MODULES IN A MULTI-VOLTAGE ON-BOARD ELECTRICAL SYSTEM AGAINST SHORT CIRCUITS

BACKGROUND OF THE INVENTION

Field of the Invention

The invention relates to a device for protecting electronic modules, in particular modules in electronic control systems, data processing and transmission systems, low-power driver circuits or CAN BUS transceivers, which are generally operated at a supply voltage Vcc=5V to 10V and are disposed in a control device, in other words ultimately control device connections in a multi-voltage on-board electrical system, for example a 42V/14V vehicle on-board electrical system against short circuits to the highest voltage occurring in said on-board electrical system.

The ever-increasing energy requirement of new electricity consumers in motor vehicles and the need to reduce fuel consumption, for example by assisting the drive train (stop and go, boost and recovered braking) are driving forces in the move from 14V on-board electrical systems to 42V on-board electrical systems.

In order to be able to operate electronic modules and components developed for a 14V on-board electrical system, which include the electronic control system and data transmission modules mentioned above, in the 42V on-board electrical system, a 14V/42V on-board electrical system was defined as an interim solution and the description which follows refers to this.

The biggest obstacle to the continued use of electronic modules and their components developed for the 14V on-board electrical system—with the low on-board electrical system voltage—in the 42V on-board electrical system—with the high on-board electrical system voltage—is their inability to withstand short circuits, for example to 50V in permanent mode or 60V in transient mode.

In motor vehicles the lines to the modules mentioned are laid in cable trees. Short circuits (flashovers, arcs) between these lines can result for example due to said lines rubbing together. The speed of the change in voltage in the event of a short circuit from for example 5V or 14V to 42V is extremely rapid, a matter of a few nanoseconds.

Protective circuits are therefore required, which can also be used later in the 42V on-board electrical system.

Although previously a permanent ability to withstand short circuits to 14V to 18V, depending on the customers' requirements, and a transient ability to withstand short circuits to 32V to 36V was adequate, in the 42V on-board electrical system, as mentioned above, it is necessary to withstand voltages for example to 50V in permanent mode and 60V in transient mode.

A typical protective circuit according to the prior art in a 14V on-board electrical system for example for a microcontroller μC disposed in a control device ST is shown in FIG. 2. The input E of the microcontroller μC is for example shown as the input of an analogue-digital converter (ADC) (not shown), to which the output signal of a sensor Se comprising a changing resistance is supplied via a line L, said output signal being digitised and further processed in the analogue-digital converter (ADC) indicated by an arrow.

A stable supply voltage Vcc, generally Vcc=5V, is supplied to the microcontroller μC by means of a regulator (not shown) in the control device ST.

The input E is assigned a protective structure integrated as standard in the microcontroller μC and protecting against electrostatic discharges, comprising a resistor R5 downstream from the input E and two diodes D3 and D4, with the diode D3 disposed between the resistor R5 and the positive pole +Vcc of the supply voltage VCC and conducting current in the direction of the positive pole +Vcc, and with the diode D4 disposed between the negative pole −Vcc of the supply voltage Vcc (ground potential GND of the control device ST) and the resistor R5 and conducting current in the direction of the resistor R5.

Two resistors R6 and R7, which are parallel to the diodes D3 and D4, represent parasitic leakage resistances. Because of the high temperatures of >100° C. occurring during operation and the temperature dependency of the leakage currents in semiconductors these values can reach up to 1 μA. This corresponds to a leakage resistance R6, R7 of approximately 2.5 MΩ each.

Disposed between the sensor S and the positive pole +Vcc in the control device but outside the microcontroller μC is a resistor R1, which together with the internal resistance Rsens of the sensor S forms a voltage divider, which is supplied with the supply voltage Vcc.

Disposed between the pick-off of this voltage divider and the input E of the microcontroller μC is a protective resistor R2.

The divider voltage of the voltage divider R1/Rsens is present at the input E of the microcontroller μC, across the protective resistor R2. It is a measure of the internal resistance of the sensor.

The protective resistor R2 should be dimensioned such that
  the error caused by the parasitic leakage resistances R6, R7 of the input protection circuit is small and
  with an external maximum voltage in the event of an error Vin=Vbat, the current flowing through the diode D3 is limited to an acceptable level, for example <5 mA.

In the 14V on-board electrical system it is however no longer possible to satisfy both requirements in the event of an increase from 14V to 42V:
  if the protective resistor R2 is so large that the current flowing through the diode D3 remains acceptably small, the voltage errors caused by the leakage currents flowing through the resistors R6, R7 become unacceptably large;
  if the value of the protective resistor R2 is left unchanged, the current that is now increased threefold (due to 14V→42V) will damage or destroy the input structure of the microcontroller μC in the event of a short circuit to 42V.

This known protective circuit is therefore not protected against a short circuit to 42V.

An overvoltage protection circuit, in particular for the inputs of integrated circuits, is known from DE 197 28 783 A1, with an overvoltage identification device, which, if an overvoltage occurs on the input line, activates a transistor connected in series to this input line and shown as a MOS field effect transistor, which then brings about a high-resistance break in this input line. In normal conditions this MOS field effect transistor (hereafter referred to as MOSFET) represents a low-resistance line in both directions.

The transistor is located with its drain source path in the line to be protected. Between the source connection and the gate connection of said transistor is a Zener diode, which limits the gate source voltage to a predefined value and between the gate connection and the positive pole of the on-board electrical system voltage is a gate resistor.

This circuit is based on the principle of identifying an overvoltage with subsequent disconnection of the in-phase transistor. However in principle voltage identification is associated with a delay time.

If an overvoltage now occurs in the form of a rapid voltage change (e.g. short circuit due to voltage flashover to the higher on-board electrical system voltage 42V), the voltage suddenly increases at the nodes to be protected until the end of the delay time plus the disconnection time of the in-phase transistor. The speed of the voltage change in the event of a short circuit to 42V is however extremely rapid, as mentioned above.

With such rapid voltage changes, disconnection of the in-phase transistor—due to the delays associated in principle—takes place only after the high voltage is already present at the nodes to be protected. This is also described in the said DE 197 28 783 A1, in that "only small switching peaks occur respectively at the start and end of each of the overvoltage pulses" (column 4, lines 62 to 65).

A circuit operating according to the same principle is known from DE 3425235 C1.

Such rapid voltage changes cause the circuits described in the two documents to fail in principle and they are therefore unsuitable for use in the twin-voltage on-board electrical system or in the single voltage on-board electrical system with the higher on-board electrical system voltage, The switching process can—depending on the design—take between several 100 ns and several μs. Destruction of the components to be protected cannot be excluded.

SUMMARY OF THE INVENTION

The object of the invention is to create a simple device for protecting electronic modules used in a 14V on-board electrical system and disposed in a control device, i.e. therefore the control device inputs and outputs, such that these modules can also be protected reliably against short circuits occurring in a 42V on-board electrical system.

This object is achieved according to the invention by a device according to the features of claim 1.

Advantageous developments of the invention will emerge from the subclaims.

Exemplary embodiments of the invention are described in more detail below with reference to a schematic drawing, in which:

DESCRIPTION OF THE PREFERRED EMBODIMENTS

The invention does not use overvoltage identification devices with subsequent disconnection of the in-phase transistor, rather it is based on the principle of limiting the current in the in-phase transistor using its pinch-off voltage.

Figure 1:
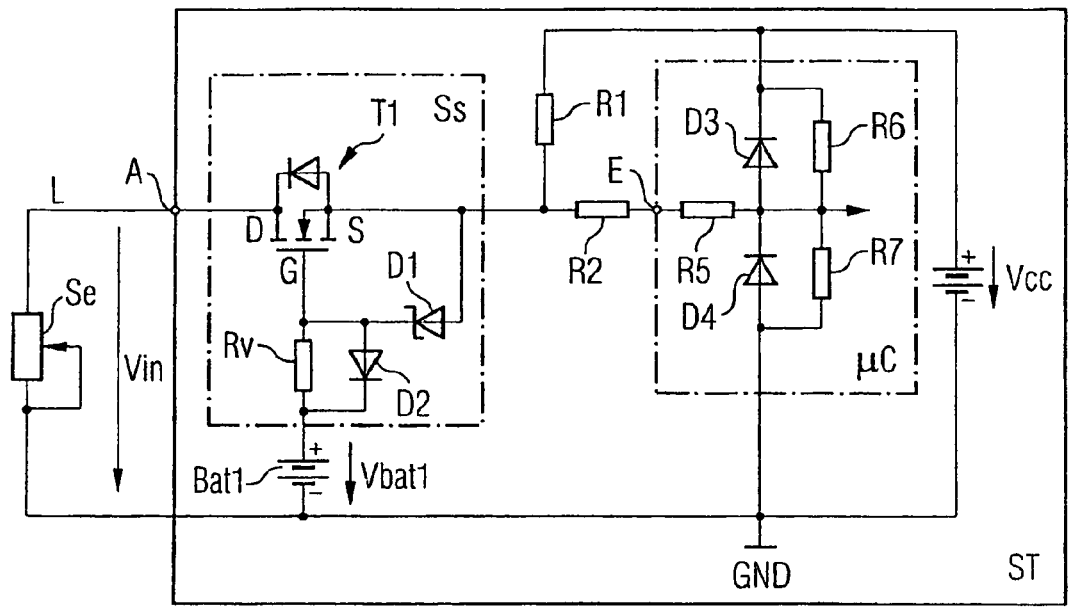
FIG. 1 shows the circuit of a claimed device for protecting electronic modules used in the 14V on-board electrical system against short circuits in a 42V on-board electrical system.
Figure 2:
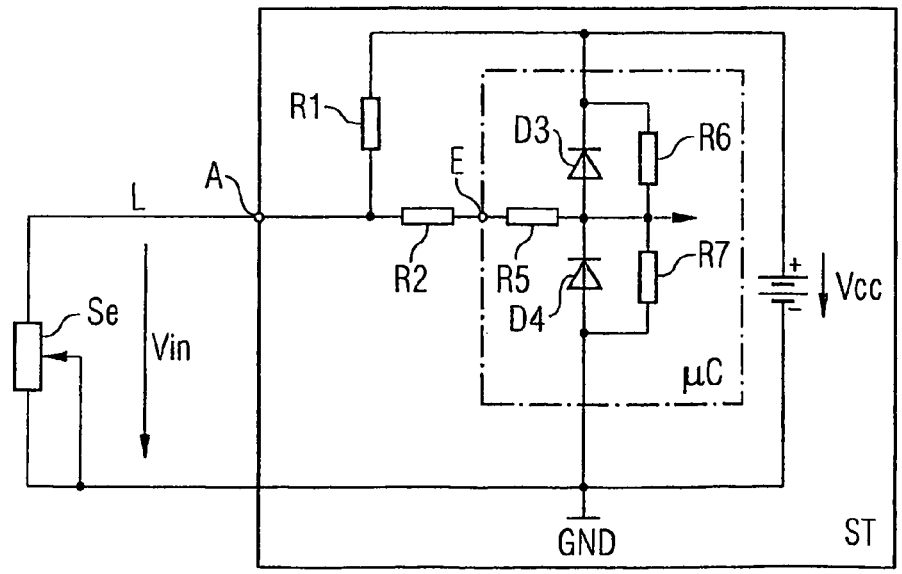
FIG. 2 shows a known protective circuit for an input of a microcontroller in a 14V on-board electrical system.

FIG. 1 shows the circuit of a claimed protective circuit Ss disposed in a control device ST for a microcontroller μC known from FIG. 2 against short circuits in a 42V on-board electrical system, said circuit being inserted between the protective resistor R2 and the line L (the control device connection A). In addition to the circuit shown in FIG. 2, FIG. 1 also shows the 14V battery Bat1 of the on-board electrical system with the low on-board voltage present in the 14V/42V on-board electrical system, while the voltage source of the on-board electrical system with the high on-board voltage is not shown.

The voltage arrow also shown in FIG. 1 indicates the voltage Vin of a sensor Se, which can also be the short-circuit voltage to the 42V on-board electrical system with maximum 60V. This voltage Vin forms the input voltage for the control device ST, the value of which is transmitted to the control device ST from the sensor Se via the line L.

The protective circuit Ss comprises a circuit set up around a transistor T1, as known from DE 197 28 783 A1. In the case of positive input voltages, this transistor T1 is preferably an N-channel low-power MOSFET (Field Effect Transistor), the drain connection D of which is connected via the control device connection A (the line L) to the sensor Se and the source connection S of which is connected to the protective resistor R2.

Disposed between the gate connection G of the transistor T1 and the positive pole +Vbat1 of the 12V battery Bat1 in the known manner is the gate resistor Rv and disposed between the gate connection G and the source connection S of the transistor T1 is a Zener diode operating as a limiter diode D1, the breakdown voltage Vz of which is selected as for example Vz=18V, such that it is not conductive in normal operation (Vz>Vbat1) but is conductive just before the maximum permitted gate source voltage Vgs of the transistor T1 is reached, e.g. Vgs=20V.

According to the invention a diode D2 is connected parallel to the gate resistor Rv, said diode conducting current in the direction from the gateway connection G to the positive pole +Vbat1 of the battery Bat1.

This diode D2 limits the gate voltage Vg of the transistor T1 to a value Vg=Vbat1+Vd, i.e. to a value of the sum of the low on-board electrical system voltage Vbat1 plus the conducting state voltage Vd of the diode D2.

In the case of negative input voltages, the transistor T1 would have to be a P-channel MOSFET, with all voltages, even the processor voltage supply, then having to be reversed. A MOSFET is thus advantageous, because it does not require control current at the operating point. In the case of bipolar transistors, with which the circuit would in principle also function, the base current could impede the measuring function as an additional error current. It is assumed below that the transistor T1 is an N-channel MOSFET and the input voltages are positive.

In the signal path from the sensor Se to the input E of the microcontroller are just the low-resistance protective resistor R2 and the comparatively low saturation resistance of the transistor T1, for example 5Ω. The sensor signal is thereby only influenced to a minimal degree.

In normal operation 0V<Vin<Vcc the transistor T1 is conductive, as its gate voltage determined across the gate resistor Rv is 14V and the gate source voltage Vgs at the transistor T1 is significantly greater than its threshold voltage Vth (for example Vth=3V).

Investigation of errors occurring:
a) in the event of a short circuit to ground potential GND (Vin=0V), the voltage at the input E is also 0V and the protective circuit Ss operates normally.
b) in the event of a short circuit to 14V (Vbat1) active at the device connection A, the source voltage Vs of the transistor T1 increases to a value Vs=Vbat1−Vth, in other words to a value Vs<Vbat1. The transistor T1 is now in the pinch-off region. The current through the diode D3 is limited by the protective resistor R2 to a predefined permitted value.

c) in the event of negative transient voltages (for example ISO test pulses) active at the device connection A, the transistor T1 becomes conductive, with its gate source voltage Vgs now being limited by the Zener diode D1. The gate resistor Rv limits the current flow through the Zener diode D1 to a tolerable value. The protective resistor R2 limits the current flow through the diode D4 of the protective structure of the microcontroller μC.

d) in the event of a short circuit to the 42V on-board electrical system active at the device connection A, the input voltage Vin increases drastically—up to maximum 60V. The source voltage Vs of the transistor T1 will increase in the event of a short circuit to 60V to a value Vs=Vbat1−Vth, i.e. a value Vs<Vbat1. As the transistor T1 is now in the pinch-off region, the total voltage difference drops there to the input voltage Vin. The drain source voltage Vds of the transistor T1 becomes Vds=Vin−(Vbat−Vth). The power loss P(T1) resulting at the transistor T1 is thereby determined by the voltage difference Vds and the current I(R2) flowing through the protective resistor R2: P(T1)=Vds*I(R2). The peak value occurring with transient voltages of 60V is <100 mW, the effective value being around 60 mW, which can be managed easily using a standard housing for the transistor T1.

If the input voltage Vin increases to values >Vbat1, the gate source voltage Vgs drops from 14V for example to the threshold voltage Vth, for example Vth=3V. The gate capacities of the transistor T1 must thereby be transferred. With very rapid transient voltages Vin an increased gate current of Ig>10 mA is required in the short term in the event of a short circuit.

If this gate current were to flow exclusively across the gate resistor Rv=10 kΩ, it would cause a major voltage drop. The gate voltage would increase to values >60V for a short time, which would result in a short-term, significantly larger current flow through the diode D3, which could damage or destroy this.

As the diode D2 parallel to the gate resistor Rv is in this case operated in the current conducting direction, it limits the gate voltage Vg of the transistor T1 to a value Vbat1+Vd, where Vd is the conducting state voltage of the diode D2.

The protective circuit thereby carries out its function in the event of an error both in the 14V on-board electrical system (low on-board voltage) and in the 42V on-board electrical system (high on-board voltage) up to the point of rapid transient changes in the input voltage Vin.

Figure 3:
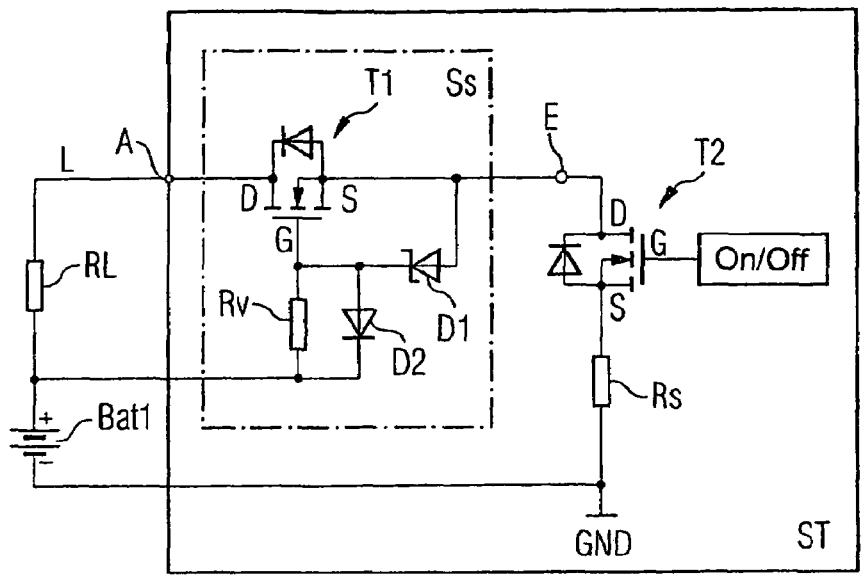
FIG. 3 shows an exemplary embodiment of the claimed protective circuit for a low-power driver circuit and FIG. 4 shows an exemplary embodiment of the claimed protective circuit for a CAN bus transceiver.

FIG. 3 shows an exemplary embodiment of the claimed protective circuit for a low-power driver circuit. A consumer RL supplied by the 14V on-board electrical system, for example a light-emitting diode of a warning light, is switched on and off by means of a switching transistor T2.

The consumer RL is connected on the one hand to the positive pole of the battery Bat1 and on the other hand via the line L and the switching transistor T2 and a protective resistor Rs to the negative pole GND of the battery Bat1. The switching transistor T2 can generally be part of an integrated circuit configured as a gang switch.

A short circuit to 42V without the claimed protective circuit would destroy the switching transistor T2.

To prevent this, the protective circuit Ss known from FIG. 1 is inserted into this configuration in the control device ST between the transistor T2 and line L, such that the drain connection D of the transistor T1 is connected via the control device connection A and line L to the consumer RL and the source connection S is connected to the switching transistor and such that the point of connection between the gate resistor Rv and the diode D2 is connected to the positive pole of the battery Bat1.

The function of the protective circuit is the same as already set out in the description of FIG. 1.

Figure 4:
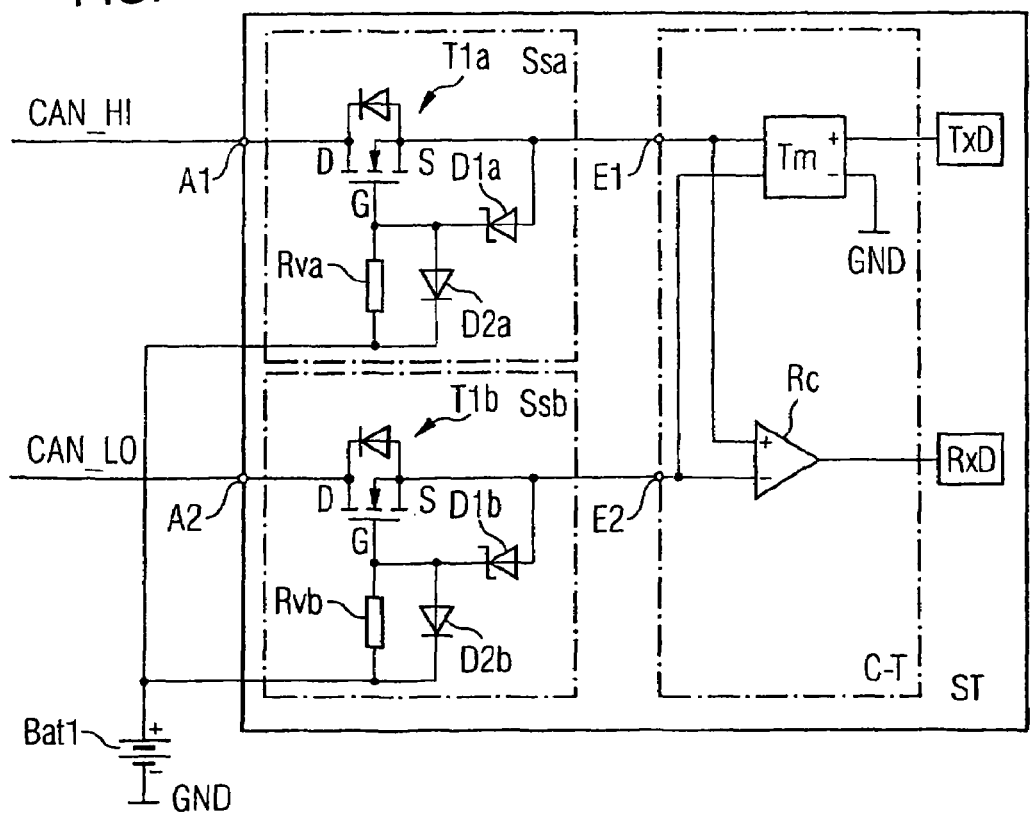

FIG. 4 finally shows a basic circuit diagram of a CAN bus transceiver C-T disposed in the control device ST with the claimed protective circuit against short circuits to 42V. The transceiver C-T comprises a transmitter TM (transmit module) and a receiver RC (receive module) in the known manner.

A suitable transceiver C-T for a high-speed version is for example a Philips PCA82C250, the data for which can be found in the data sheet "Philips semiconductors PCA82C250 CAN controller interface, Product specification, 13 Jan. 2000".

A high-speed CAN BUS generally has two differentially operated lines CAN_HI and CAN_LO, the voltages of which are generally 2.5V+1V and 2.5V−1V.

Each of the two bus lines CAN_HI and CAN_LO is equipped with its own
  protective circuit Ssa disposed in the control device ST: between the bus line CAN_HI or control device connection A1 and the connection E1 of the transmitter Tm (Ssa) and
  protective circuit Ssb disposed in the control device ST: between the bus line CAN_LO or control device connection A2 and the connection E2 of the receiver Rc.

In normal operation the protective circuits do not influence the transmitter and receiver functions due to the low saturation resistances of T1a and T1b. The voltage at the transceiver C-T is only limited to a—permitted—value Vbat−Vth in the event of a short circuit to 42V.

The function of the protective circuits Ssa and Ssb is the same as already set out in the description of FIG. 1.

The claimed protective circuit is significantly simpler than the circuit known from DE 197 28 783 A1 and has significantly fewer components.

It is suitable
  for protecting analogue and digital control device inputs of electronic control system modules and data transmission modules (data interfaces), as well as low-power driver circuits or CAN BUS transceivers, which are operated at a supply voltage of Vcc=5V to 10V for example and are generally disposed in a control device;
  it protects the connections (control device inputs and outputs) reliably, even in the continued presence of high, positive overvoltages; even rapid positive transients such as a short circuit to 60V are not allowed through and are therefore reliably managed and negative transients (e.g. ISO test pulses) are tolerated;
  it is intrinsically safe and can be implemented economically and simply with standard components;
  its circuit design is suitable for integration in an ASIC, which can also be used later in the 42V single voltage on-board electrical system;
  in normal operation it has no significant influence on the accuracy of the capture of measured values;
  in normal operation it does not influence the data transmission function.

The invention claimed is:
1. A device for protecting an electronic module disposed in a control device in a multi-voltage on-board electrical system having an accumulator with a low on-board electrical system voltage against short circuiting to a high on-board electrical system voltage, comprising:
- a MOSFET transistor having a drain source path inserted between a control device connection and a connection of the electronic module, and with:
  - a source connected to the connection of the electronic module;
  - a drain connected to the control device connection; and
  - a gate;
- a Zener diode connected between said gate and said source of said MOSFET transistor;
- a gate resistor connected between said gate of said MOSFET transistor and a positive pole of the first accumulator; and
- a diode connected in parallel with said gate resistor, for conducting current in a direction from said gate to the positive pole of the accumulator;
- wherein when a short circuit to the high on board electrical system voltage is conducted to said drain, said MOSFET transistor turns on or remains turned on; and
- wherein said MOSFET transistor has a threshold voltage and, in an event of a short circuit to a highest voltage of the on-board electrical system active at the device connection, a source voltage of said transistor is limited to a value $Vs=Vbat1-Vth$, where $Vs$ is the source voltage, $Vbat1$ is the low on-board voltage, and $Vth$ is the threshold voltage of said transistor.

2. The device according to claim 1, wherein said electronic module is disposed in control device for controlling low-power consumers or for processing/transmitting data.

3. The device according to claim 1, wherein said Zener diode is configured with a breakdown voltage lower than a maximum permitted gate source voltage of said MOSFET transistor.

4. The device according to claim 1, wherein, on occurrence of a the short circuit to the highest voltage of the on-board electrical system active at the device connection, said diode connected in parallel to said gate resistor limits the gate voltage of said MOSFET transistor to a value $Vg=Vbat1+Vd$, wherein $Vg$ is the gate voltage, $Vbat1$ is the low on-board voltage, and $Vd$ is a conducting state voltage of said diode.

5. The device according to claim 1, with the protective circuit integrated in an ASIC.

6. The device according to claim 1, wherein the multi-voltage on-board electrical system is a motor vehicle on-board electrical system.

* * * * *